United States Patent
Inhofer et al.

(10) Patent No.: US 11,545,387 B2
(45) Date of Patent: Jan. 3, 2023

(54) MAGNETIC INTEGRATED LIFT PIN SYSTEM FOR A CHEMICAL PROCESSING CHAMBER

(71) Applicant: TEL FSI, Inc., Chaska, MN (US)

(72) Inventors: William Inhofer, Plymouth, MN (US); Sean Moore, Maple Grove, MN (US); Todd Maciej, Little Falls, MN (US)

(73) Assignee: TEL MANUFACTURING AND ENGINEERING OF AMERICA, INC., Chaska, MN (US)

( * ) Notice: Subject to any disclaimer, the term of this patent is extended or adjusted under 35 U.S.C. 154(b) by 747 days.

(21) Appl. No.: 16/509,010

(22) Filed: Jul. 11, 2019

(65) Prior Publication Data
US 2020/0020566 A1     Jan. 16, 2020

Related U.S. Application Data

(60) Provisional application No. 62/697,429, filed on Jul. 13, 2018.

(51) Int. Cl.
*H01L 21/687* (2006.01)
*H01F 7/16* (2006.01)
(Continued)

(52) U.S. Cl.
CPC ...... *H01L 21/68742* (2013.01); *B25B 11/002* (2013.01); *H01F 7/081* (2013.01);
(Continued)

(58) Field of Classification Search
CPC ... H01F 7/081; H01F 7/16; H01F 7/18; H01F 7/1607; H01L 21/7259; H01L 21/68742; B25B 11/002
See application file for complete search history.

(56) References Cited

U.S. PATENT DOCUMENTS

| | | | |
|---|---|---|---|
| 3,538,883 A | | 11/1970 | Polin |
| 5,270,600 A | * | 12/1993 | Hashimoto .......... H02K 49/106 464/29 |

(Continued)

FOREIGN PATENT DOCUMENTS

| | | |
|---|---|---|
| CN | 105314343 A | 2/2016 |
| JP | 1987173718 A | 7/1987 |

(Continued)

OTHER PUBLICATIONS

PCT/US2017/0695166, PCT International Search Report, dated Mar. 29, 2018, 3 pgs.

(Continued)

*Primary Examiner* — Matthew W Jellett
(74) *Attorney, Agent, or Firm* — Kagan Binder, PLLC

(57) ABSTRACT

The present invention provides lift pin strategies with a reduced risk of causing contamination due to the up and down actuation of lift pins. The present invention provides a lift pin system that uses electromagnetic actuation strategies in order to raise and lower lift pins. The electromagnetic forces act remotely on the lift pins so that direct contact or coupling of the lift pins to actuation components is not required. This avoids contamination that otherwise would be associated with friction and associated lubricants used for mechanical actuation strategies.

17 Claims, 13 Drawing Sheets

(51) Int. Cl.
  *B25B 11/00*   (2006.01)
  *H01F 7/18*   (2006.01)
  *H01L 21/67*   (2006.01)
  *H01F 7/08*   (2006.01)

(52) U.S. Cl.
  CPC ............... *H01F 7/16* (2013.01); *H01F 7/18* (2013.01); *H01L 21/67259* (2013.01)

(56) References Cited

U.S. PATENT DOCUMENTS

| | | | |
|---|---|---|---|
| 5,554,964 | A | 9/1996 | Jansseune |
| 5,598,974 | A | 2/1997 | Lewis et al. |
| 5,730,803 | A | 3/1998 | Steger et al. |
| 5,818,137 | A * | 10/1998 | Nichols ............... F16C 32/0493 310/90 |
| 5,820,104 | A * | 10/1998 | Koyano ............ H01L 21/68792 310/12.32 |
| 5,887,605 | A | 3/1999 | Lee et al. |
| 5,961,732 | A | 10/1999 | Patrin et al. |
| 5,965,047 | A | 10/1999 | Blersch et al. |
| 6,136,163 | A * | 10/2000 | Cheung ............... H01L 21/6723 204/198 |
| 6,146,463 | A | 11/2000 | Yudovsky et al. |
| 6,168,665 | B1 | 1/2001 | Sakai et al. |
| 6,217,423 | B1 | 4/2001 | Ohmori et al. |
| 6,241,577 | B1 | 6/2001 | Shibata |
| 6,290,569 | B1 | 9/2001 | Mizuno et al. |
| 6,435,708 | B1 | 8/2002 | Satoh |
| 6,800,833 | B2 * | 10/2004 | Gregor .................... C30B 31/14 219/390 |
| 7,204,888 | B2 | 4/2007 | Tran et al. |
| 7,332,691 | B2 * | 2/2008 | Choi .................. H01L 21/67109 118/724 |
| 7,860,379 | B2 * | 12/2010 | Hunter ............. H01L 21/67248 392/416 |
| 8,314,371 | B2 * | 11/2012 | Sorabji .................. H01L 21/324 257/E21.328 |
| 8,844,546 | B2 | 9/2014 | Chen et al. |
| 9,564,378 | B2 | 2/2017 | Rose et al. |
| 9,689,507 | B2 * | 6/2017 | Taguchi .................. F16K 51/02 |
| 9,837,260 | B2 | 12/2017 | Inai et al. |
| 10,012,316 | B2 * | 7/2018 | Taguchi ............... F16K 3/0218 |
| 10,418,270 | B2 | 9/2019 | Hanzlik et al. |
| 10,468,277 | B2 | 11/2019 | Schoeb |
| 10,843,236 | B2 | 11/2020 | Butterbaugh |
| 10,910,253 | B2 | 2/2021 | Inhofer et al. |
| 10,991,610 | B2 | 4/2021 | Butterbaugh et al. |
| 11,020,774 | B2 | 6/2021 | Mbanaso |
| 11,035,488 | B2 * | 6/2021 | Kozaki .................... F16K 51/02 |
| 11,268,630 | B2 * | 3/2022 | Hosek ....................... F16K 3/10 |
| 2002/0017237 | A1 | 2/2002 | Wirth et al. |
| 2002/0157686 | A1 | 10/2002 | Kenny et al. |
| 2003/0015141 | A1 | 1/2003 | Takagi |
| 2003/0132746 | A1 | 7/2003 | Cox |
| 2003/0156270 | A1 | 8/2003 | Hunter |
| 2003/0178145 | A1 | 9/2003 | Anderson et al. |
| 2003/0205329 | A1 | 11/2003 | Gujer et al. |
| 2003/0230323 | A1 | 12/2003 | You et al. |
| 2004/0004713 | A1 | 1/2004 | Go et al. |
| 2004/0005212 | A1 * | 1/2004 | Wu ........................ H01L 21/68 414/757 |
| 2004/0163670 | A1 | 8/2004 | Ko et al. |
| 2004/0221877 | A1 | 11/2004 | Bergman |
| 2005/0031497 | A1 | 2/2005 | Siebert et al. |
| 2005/0127927 | A1 | 6/2005 | Harris et al. |
| 2006/0039781 | A1 | 2/2006 | Niewmierzycki et al. |
| 2006/0162739 | A1 | 7/2006 | Sogard |
| 2006/0182528 | A1 * | 8/2006 | Fan .................... H01L 21/68742 414/155 |
| 2007/0209684 | A1 | 9/2007 | Chen et al. |
| 2007/0247778 | A1 | 10/2007 | Harb et al. |
| 2008/0056857 | A1 | 3/2008 | Hiroki |
| 2008/0099090 | A1 * | 5/2008 | Cook .................... F15B 13/0402 360/78.12 |
| 2008/0229811 | A1 * | 9/2008 | Zhao ................... F16C 32/0603 73/104 |
| 2008/0280453 | A1 | 11/2008 | Koelmel et al. |
| 2009/0114253 | A1 | 5/2009 | Matsumoto |
| 2009/0314211 | A1 | 12/2009 | Du Bois et al. |
| 2010/0012856 | A1 | 1/2010 | Aoki |
| 2010/0048106 | A1 | 2/2010 | Wang et al. |
| 2011/0188974 | A1 | 8/2011 | Diamond |
| 2012/0325275 | A1 | 12/2012 | Goodman et al. |
| 2013/0062839 | A1 | 3/2013 | Tschiderle et al. |
| 2013/0152971 | A1 | 6/2013 | Kato |
| 2013/0214497 | A1 | 8/2013 | Yoshida |
| 2013/0233356 | A1 | 9/2013 | Obweger et al. |
| 2014/0152976 | A1 | 6/2014 | VanHoomissen et al. |
| 2014/0166055 | A1 | 6/2014 | Haung et al. |
| 2014/0265098 | A1 | 9/2014 | Himmelsbach et al. |
| 2014/0332161 | A1 | 11/2014 | Ricci et al. |
| 2015/0052702 | A1 | 2/2015 | Dobashi et al. |
| 2015/0187629 | A1 * | 7/2015 | Obweger .......... H01L 21/68785 156/345.55 |
| 2015/0279708 | A1 | 10/2015 | Kobayashi et al. |
| 2016/0064213 | A1 | 3/2016 | Sakai et al. |
| 2016/0096207 | A1 | 4/2016 | Butterbaugh et al. |
| 2016/0172256 | A1 | 6/2016 | Rose et al. |
| 2016/0303617 | A1 | 10/2016 | Mbanaso et al. |
| 2017/0338131 | A1 | 11/2017 | Amahisa et al. |
| 2017/0341093 | A1 | 11/2017 | Hanzlik |
| 2018/0025904 | A1 | 1/2018 | DeKraker |
| 2018/0130694 | A1 | 5/2018 | Inhofer et al. |
| 2018/0151396 | A1 | 5/2018 | Hanzlik et al. |
| 2018/0158717 | A1 | 6/2018 | Hanzlik et al. |
| 2018/0214915 | A1 | 8/2018 | Butterbaugh |
| 2019/0255580 | A1 | 8/2019 | Mbanaso |
| 2021/0023591 | A1 | 1/2021 | Butterbaugh |
| 2022/0102188 | A1 * | 3/2022 | Tang ................. H01L 21/67757 |

FOREIGN PATENT DOCUMENTS

| | | |
|---|---|---|
| JP | 1993023542 U | 3/1993 |
| JP | 2001079505 A | 3/2001 |
| JP | 2002086048 A | 3/2002 |
| JP | 2003017547 A | 1/2003 |
| JP | 2003179040 A | 6/2003 |
| JP | 2005098163 A | 4/2005 |
| JP | 2005225621 A | 8/2005 |
| JP | 2006005177 A | 1/2006 |
| JP | 2007123790 A | 5/2007 |
| JP | 2008182228 A | 8/2008 |
| JP | 2008252007 A | 10/2008 |
| JP | 2010514167 A | 4/2010 |
| JP | 2011-216888 A | 10/2011 |
| JP | 2012-21275 A | 11/2012 |
| JP | 2014049605 A | 3/2014 |
| JP | 2015041646 A | 3/2015 |
| JP | 2016-076702 A | 5/2016 |
| JP | 2016076702 A | 5/2016 |
| KR | 100187445 B1 | 4/1999 |
| KR | 20110036915 A | 4/2011 |
| KR | 2016-0041021 A | 4/2016 |
| WO | 2008077048 A3 | 6/2008 |
| WO | 2010054076 A2 | 5/2010 |
| WO | 2014170928 A | 10/2014 |
| WO | 2016/057524 A1 | 4/2016 |

OTHER PUBLICATIONS

PCT/US2014/069557, PCT International Search Report, dated Mar. 3, 2015, 4 pgs.
PCT/US2017/063486, PCT International Search Report, dated Mar. 5, 2018, 3 pgs.
PCT/US2017060543, PCT International Search Report, dated Feb. 20, 2018, 3 pgs.
PCT/US2018/015545, PCT International Search Report, dated May 14, 2018, 4 pgs.
PCT/US2019/018405 PCT International Search Report, dated May 6, 2019, 2018, 3 pgs.
JP 2019-528673, English Translation of Notice of Reason(s) for Rejection, dated Dec. 14, 2021, pp. 1-7.

(56) References Cited

OTHER PUBLICATIONS

JP 2019-530478, English Translation of Notice of Reason(s) for Rejection, dated Nov. 30, 2021, pp. 1-6.
JP 2019-540660, English Translation of Notice of Reason(s) for Rejection, dated Nov. 9, 2021, pp. 1-6.
Japanese Patent Application No. 2019-524030, Office Action dated Oct. 14, 2021, non-English and translated, pp. 1-16.
Japanese Patent Application No. 2019-524030, Office Action dated May 10, 2022, non-English and translated, pp. 1-16.
Korean Patent Application No. 10-2019-7025028, Office Action dated May 10, 2022, non-English and translated, pp. 1-16.
Korean Patent Application No. 10-2019-7019429, Office Action dated May 29, 2022, non-English and translated, pp. 1-12.
Korean Patent Application No. 10-2019-7016273, Office Action dated May 13, 2022, non-English and translated, pp. 1-17.
Chinese Patent Application No. 201780076253.9, Office Action dated Sep. 14, 2022, non-English and translated, pp. 1-23.

\* cited by examiner

MAGNETIC INTEGRATED LIFT PIN SYSTEM FOR A CHEMICAL PROCESSING CHAMBER

PRIORITY

The present nonprovisional patent Application claims priority under 35 U.S.C. § 119(e) from United States Provisional patent application having Ser. No. 62/697,429, filed on Jul. 13, 2018, by Inhofer et al. and titled MAGNETIC INTEGRATED LIFT PIN SYSTEM FOR A CHEMICAL PROCESSING CHAMBER, wherein the entirety of said provisional patent application is incorporated herein by reference for all purposes.

FIELD OF THE INVENTION

The present invention relates to lift pin systems for microelectronic substrate processing and to apparatuses and methods that incorporate such lift pin systems. More particularly, the present invention relates to such lift pin systems in which electromagnetic forces are used to help control the raising and lowering of the lift pins.

BACKGROUND OF THE INVENTION

Semiconductor device fabrication uses substrates/wafers, such as circular silicon substrates/wafers, to form microelectronic devices using various fabrication processes implemented in variety of types of process chambers. Accordingly, the wafers are transferred among many tools to deposit, etch, clean, coat, and/or pattern the wafers. In most instances, the wafers are transported in carriers (such as Front Opening Unified Pods, or FOUPs) from tool to tool in order to protect the wafers from contamination.

A typical FOUP holds several wafers. The wafers are stacked apart in a FOUP in order to allow room for a robot end effector on a robot arm to load and unload individual wafers from the FOUP. In effect, the end effector can be viewed as a hand on the robot arm. It is also desirable to avoid contact between the wafers held in a FOUP to avoid causing physical damage to the wafers. Once a FOUP carrier is at a tool, a wafer handling robot transfers the wafers between the FOUP and the tool's process chuck disposed within a process chamber.

The robot picks up a wafer from the carrier using a thin-profile end effector on a mechanical arm to extend between the wafers in the carrier. The carrier may be indexed downward, or lowered to the right zone, so that the robot arm can retrieve a desired wafer without touching the other wafers. The backside of the wafer being retrieved makes contact with and rests on the end effector. The robot arm lifts the wafer from its slot in the FOUP so that the wafer is no longer in physical contact with the FOUP. Thus holding the wafer, the mechanical arm is withdrawn from the FOUP and moves the wafer towards the process chamber. Still holding the wafer, the robot arm moves the wafer into the process chamber above the process chuck. The goal is to now set the wafer onto the chuck.

In most instances, the robot arm system is unable to place the wafer directly onto the process chuck without assistance, because the end effector is between the wafer and the chuck. Somehow, the end effector needs to set the wafer down before the end effector can withdraw. A common approach to this issue is for the wafer to be set on an intermediate mechanism such as the lift pins of a lift pin assembly. A lift pin assembly often includes three or more lift pins connected to an actuating member that supports the pins. The actuating member can move the lift pins upward and downward. When lifted upward, the upper tips of the lift pins extend above the top surface of the chuck. This provides clearance room so that the robot arm can lower the wafer onto the pins. Once the wafer is supported on the pins, the robot arm can be removed from the process chamber, leaving the wafer behind in the process chamber supported on the lift pins. The lift pin assembly can now be lowered in order to place the wafer onto the top surface of the underlying chuck.

Withdrawing the wafer from the chamber is handled in a similar way using the lift pins as an intermediate support. The lift pin assembly is raised in order to lift the wafer above the chuck. This provides clearance so that the end effector can move underneath the wafer, lift the wafer from the lift pins, and then withdraw the wafer from the chamber. Often, the robot arm then places the wafer back inside a protective FOUP.

In most instances, actuation of the lift pin assembly to move the wafer up and down within the process chamber may generate contamination. Contamination may result from any movement of the lift pins or actuation mechanism used to lift or lower the wafer due to the friction between moving components. Also, lubricants associated with lift pin actuation also can be a source of contamination.

Various techniques have been used in order to reduce the risk of contamination due to lift pin actuation. In some instances, the lift pin systems are designed to isolate a portion of the mechanical system outside of the process chamber to prevent the outside components from causing contamination inside the process chamber. The exterior mechanical system may be connected to the interior components of the assembly through sealed ports. Unfortunately, such seals also may be another source of contamination.

FIGS. 1 (prior art) and 2 (prior art) show a conventional chamber assembly 10 that incorporates a lift pin assembly 12 with both interior and exterior components, Chamber assembly 10 generally includes a housing 14 defining a process chamber 16. Housing incorporates an egress 18 through which wafers can be loaded into and taken from the process chamber 16. Gate valve assembly 20 helps to isolate the process chamber 16 from the wafer transfer environment and is operable to open and close the egress 18 to the process chamber 16. Lid 21 is fitted with a handle 22 and sensor assembly 24 used, for example, to detect the presence of a wafer. Exhaust system 26 is used to help pull materials from the chamber and to establish a vacuum inside process chamber 16. Drive 28 rotatably drives shaft assembly 30. Rotary seal 31 protects the egress of the shaft assembly 30. Shaft assembly 30 is hollow to allow electrical lines and the like to be fed to and from the process chamber 16.

A rotatable and translatable chuck 32 is housed inside the process chamber 16. Chuck 32 includes a lower chuck portion 34 and an upper chuck portion 36. Lower chuck 34 is mounted in off-center/eccentric fashion to rotatable shaft assembly 30 that rotates about axis 31. As a consequence of the off-center mounting of chuck 32, rotation of shaft assembly 30 causes chuck 32 to be translated in an arc-shaped path inside process chamber 16. The arc-shaped path is centered about axis 31. In practical effect, the off-center rotation causes the chuck 32 to orbit the axis 31 through a suitable range of motion. As the chuck 32 translates along this arc, it is swept through a nozzle assembly (not shown) that includes at least one nozzle through which treatment material can be dispensed onto a wafer (not shown) held on the chuck 32. Support structure 40 helps to support the chuck 32.

In the meantime, upper chuck portion 36 is able to rotate about axis 42 independently of the lower chuck portion 34. In this way, a wafer held on chuck 32 can be rotated about axis 42 and/or translated below nozzle assembly in an orbit or arc-shaped path about axis 31.

Lift pin system 12 includes exterior components 44 outside process chamber as well as interior components 46 inside process chamber 16. The interior components 46 include lift pins 48 supported on an actuation plate 50. The interior components 46 are connected to the exterior components 44 by a lift pin shaft 51 that passes through a vacuum sealed port in the floor of the chamber housing 14. The shaft 51 moves vertically up and down to allow the lift pins 48 to lift and lower the wafer from the process chuck to either pick up the wafer from the transfer robot or place the wafer on the process chuck 32.

The exterior components 44 include an air cylinder used to drive a lift pin shaft up and down. Such an air cylinder would create unacceptable contamination if it were located inside process chamber 16 due to friction and lubricants. Also, the lift pin shaft 51 passes through a vacuum-sealed port intended to prevent ambient air or particles from entering the process chamber 16. This port, however, nonetheless creates a potential leak source as well as a potential source of contaminating particles from friction during actuation.

The industry has a strong need for lift pin strategies with a reduced risk of causing contamination due to the up and down actuation of the lift pins.

SUMMARY OF THE INVENTION

The present invention provides lift pin strategies with a reduced risk of causing contamination due to the up and down actuation of lift pins. The present invention provides a lift pin system that uses electromagnetic actuation strategies in order to raise and lower lift pins. The electromagnetic forces act remotely to raise and lower the lift pins and their supporting structure so that direct contact or coupling of the lift pins to driving components is not required. This avoids contamination that otherwise would be associated with friction and associated lubricants used for purely mechanical actuation strategies.

Additionally, all moving components of a lift pin assembly may be entirely enclosed within a process chamber. Hence, the lift pin system does not require a combination of internal and external mechanical systems to pick and place the wafer onto the wafer chuck. This is desirable because ports that allow moving components to operate both inside and outside a process chamber not only are friction sources for particles but also may allow ambient air or other ambient contamination to leak into the process chamber. The new strategies reduce potential contamination sources by allowing pass-through ports to be avoided, if desired, through the process chamber walls. The ability to entirely house moving components of a lift pin assembly inside a process chamber would be particularly desirable with respect to sub-atmospheric or atmospheric process applications within the semiconductor, chemical, medical, or biological treatment applications that pick-n-place samples within a process chamber.

As an additional advantage, electromagnetic actuation strategies allow the lift-pin assembly to be co-located with or even connected to the process chuck, such that the lift-pin assembly could translate with the process chuck, if desired.

In one aspect, the present invention relates to an apparatus for treating a microelectronic substrate, said apparatus comprising:

a process chamber in which the microelectronic substrate is subjected to a treatment;

a wafer holder disposed within the process chamber, wherein the wafer holder comprises a top surface and a bottom surface opposite the top surface, wherein the microelectronic substrate is held over the top surface during a treatment, and wherein the wafer holder comprises and at least three pass-through openings between the top surface and the bottom surface; and a lift-pin assembly disposed within the process chamber and proximate to the support plate, the lift pin assembly comprising:

a lift pin support structure;

three or more lift pins connected to the lift pin support structure, each lift pin being axially alignable with a corresponding pass-through opening in the wafer holder so that the lift pins can be raised and lowered through the wafer holder such that the lift pins project above the top surface of the wafer holder in a first, raised configuration and such that the lift pins are below the top surface of the wafer holder in a second, lowered configuration; and an actuator device disposed in the process chamber that is magnetically coupled to the lift pin assembly such that the actuator device magnetically raises and lowers the lift pin assembly.

In another aspect, the present invention relates to a method of raising and lowering a lift pin assembly, comprising the steps of:

providing a wafer holder in a process chamber, wherein the wafer holder comprises a top surface and a bottom surface opposite the top surface, and wherein the wafer holder comprises and at least three pass-through openings between the top surface and the bottom surface;

providing a lift pin assembly comprising a plurality of lift pins supported on a lift pin support structure, each lift pin being axially alignable with a corresponding pass-through opening in the wafer holder so that the lift pins can be raised and lowered through the wafer holder such that the lift pins project above the top surface of the wafer holder in a first, raised configuration and such that the lift pins are below the top surface of the wafer holder in a second, lowered configuration; and using a magnetic force to remotely raise and lower the lift pin assembly.

DETAILED DESCRIPTION OF PRESENTLY PREFERRED EMBODIMENTS

The present invention will now be further described with reference to the following illustrative embodiments. The embodiments of the present invention described below are not intended to be exhaustive or to limit the invention to the precise forms disclosed in the following detailed description. Rather a purpose of the embodiments chosen and described is so that the appreciation and understanding by others skilled in the art of the principles and practices of the present invention can be facilitated.

Figure 1:
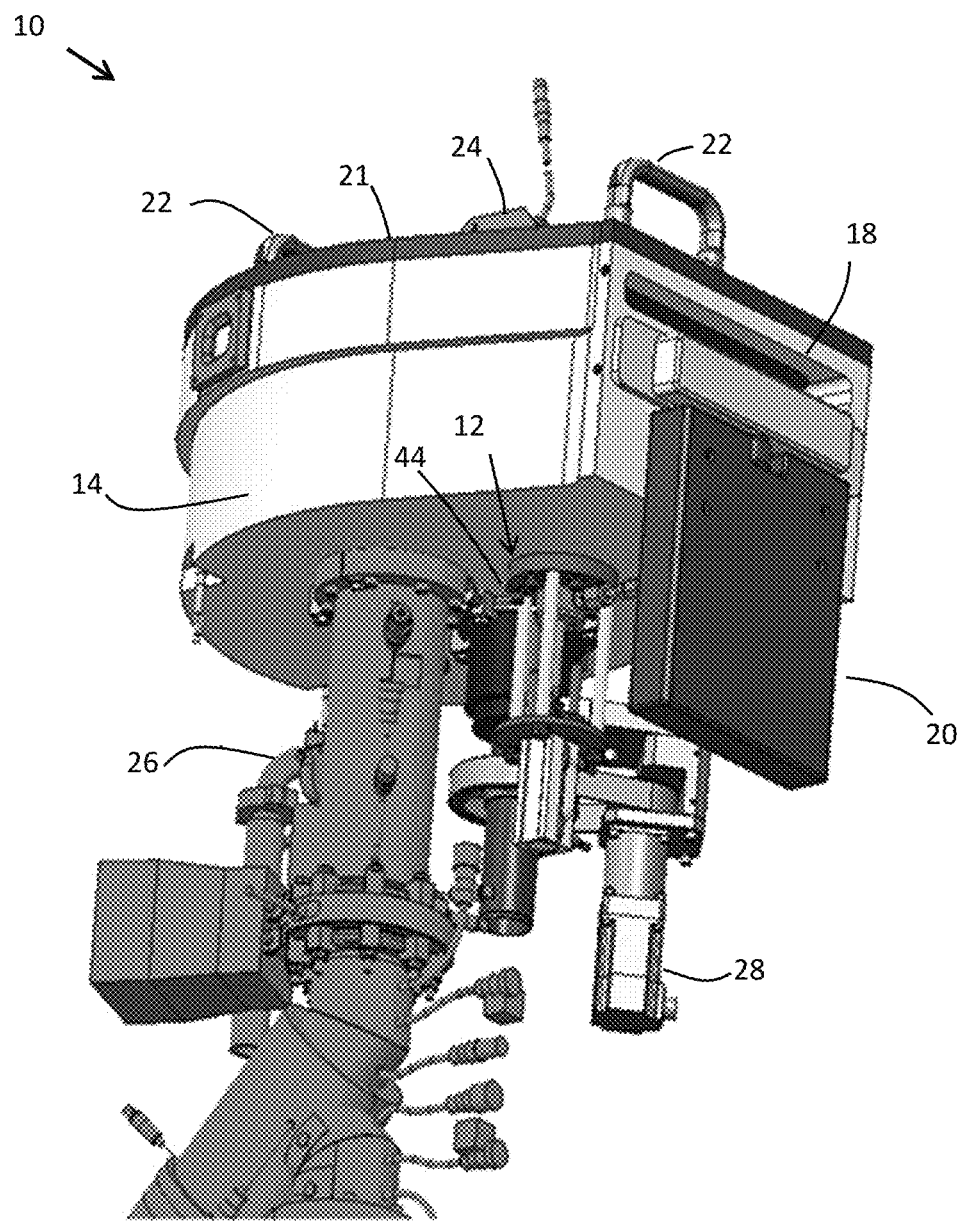
FIG. 1 (Prior art) is a perspective view of a conventional chamber assembly incorporating a lift pin system that has moving components both inside and outside the chamber assembly.
Figure 2:
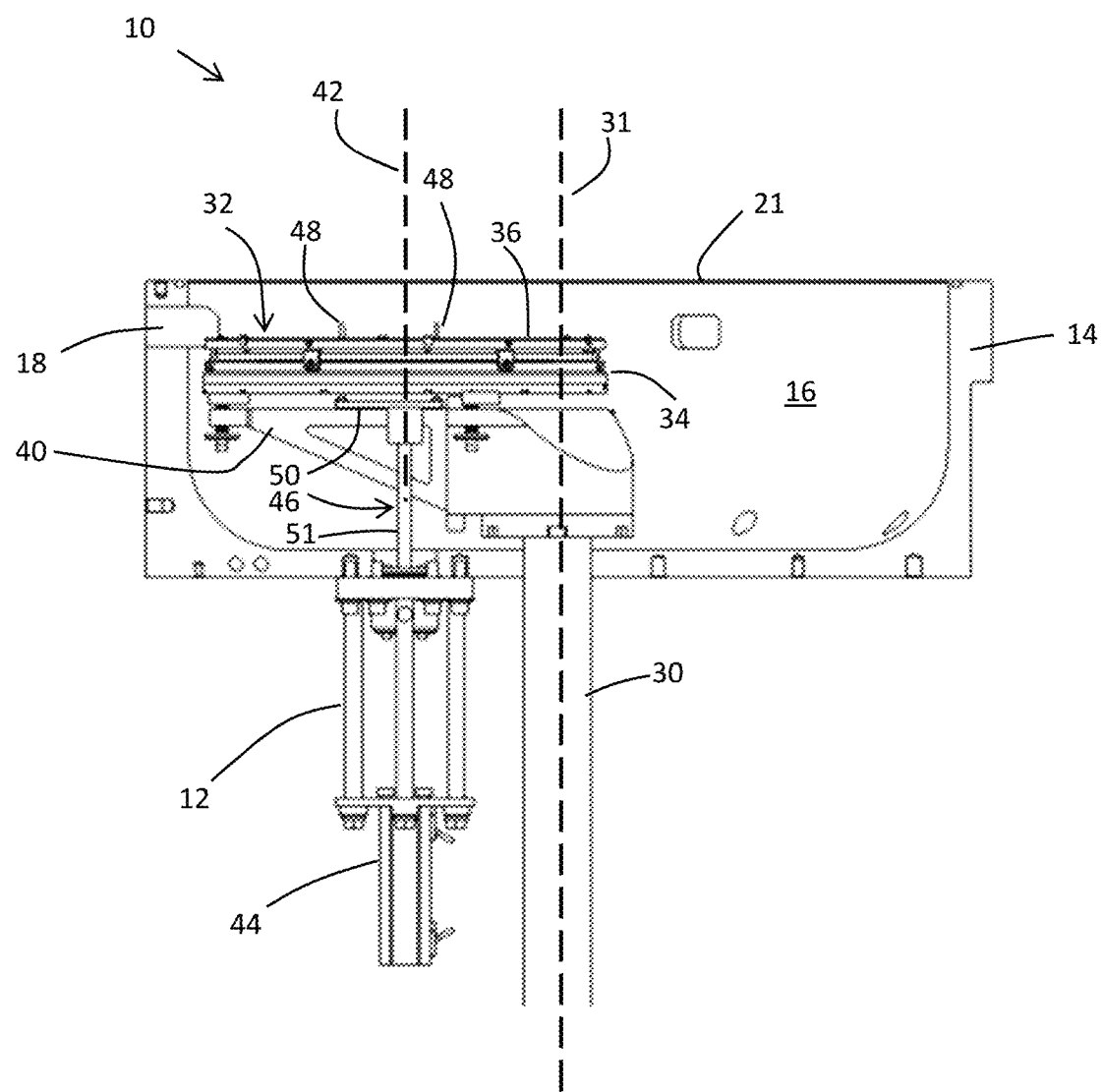
FIG. 2 (Prior art) is a side view with some parts shown in cross-section of the chamber assembly of FIG. 1.
Figure 3:
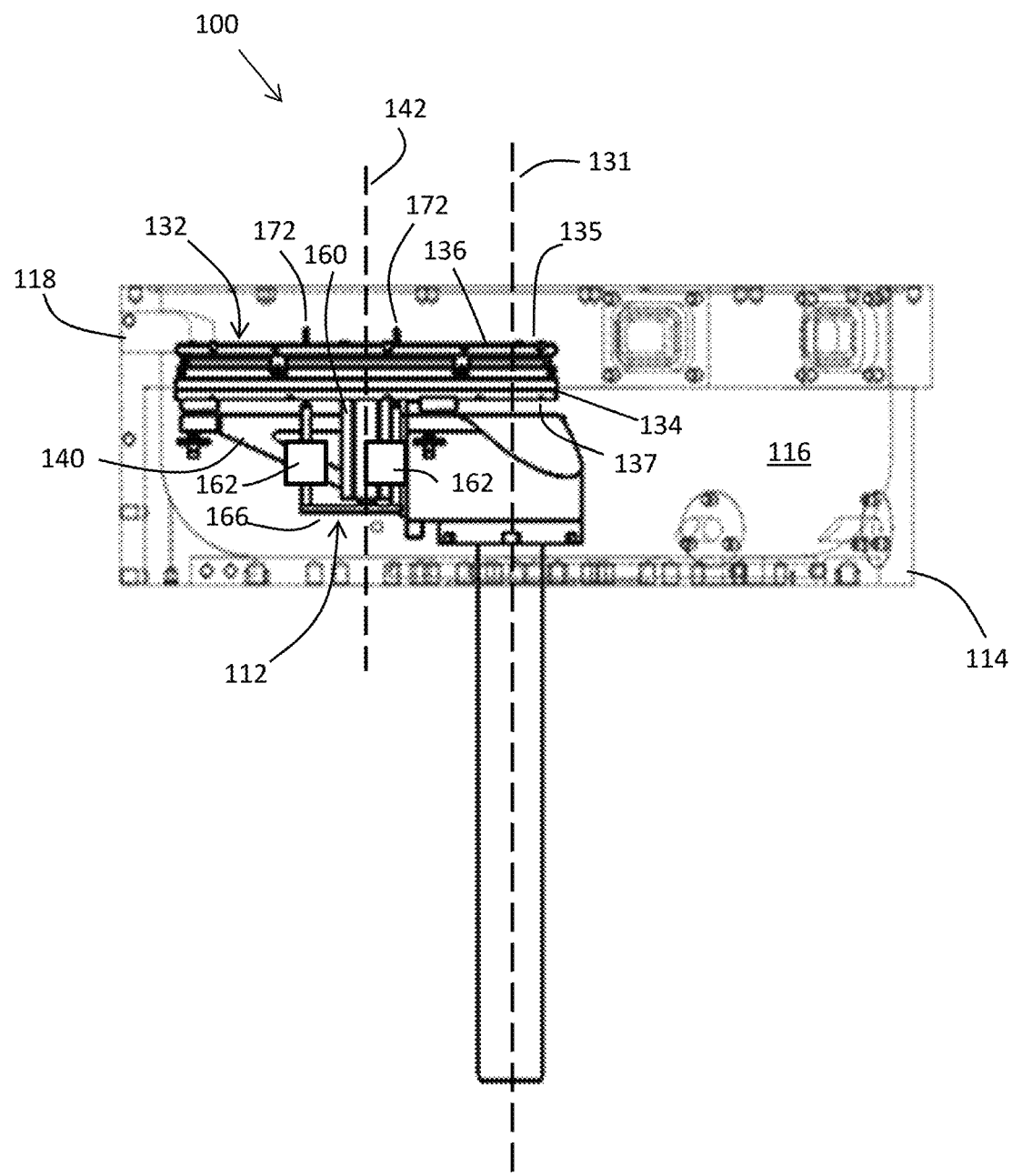
FIG. 3 is a side, cross-section view of a chamber assembly of the present invention.
Figure 4:
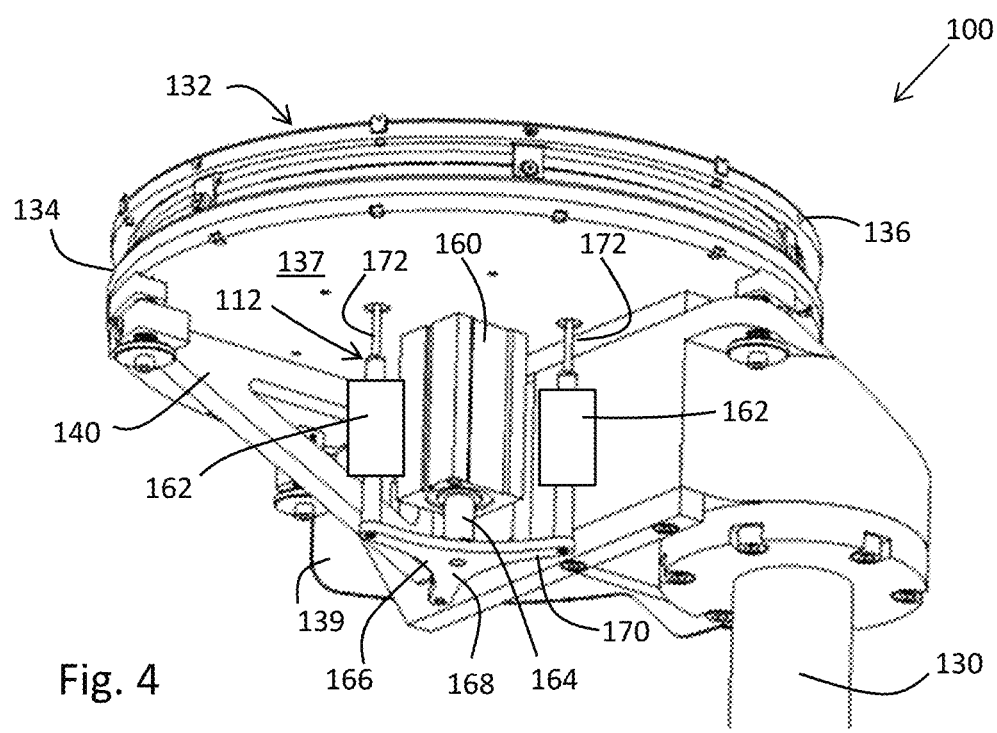
FIG. 4 is a bottom perspective view of the chamber assembly of FIG. 3, wherein the lift pin system is in a lowered configuration.
Figure 5:
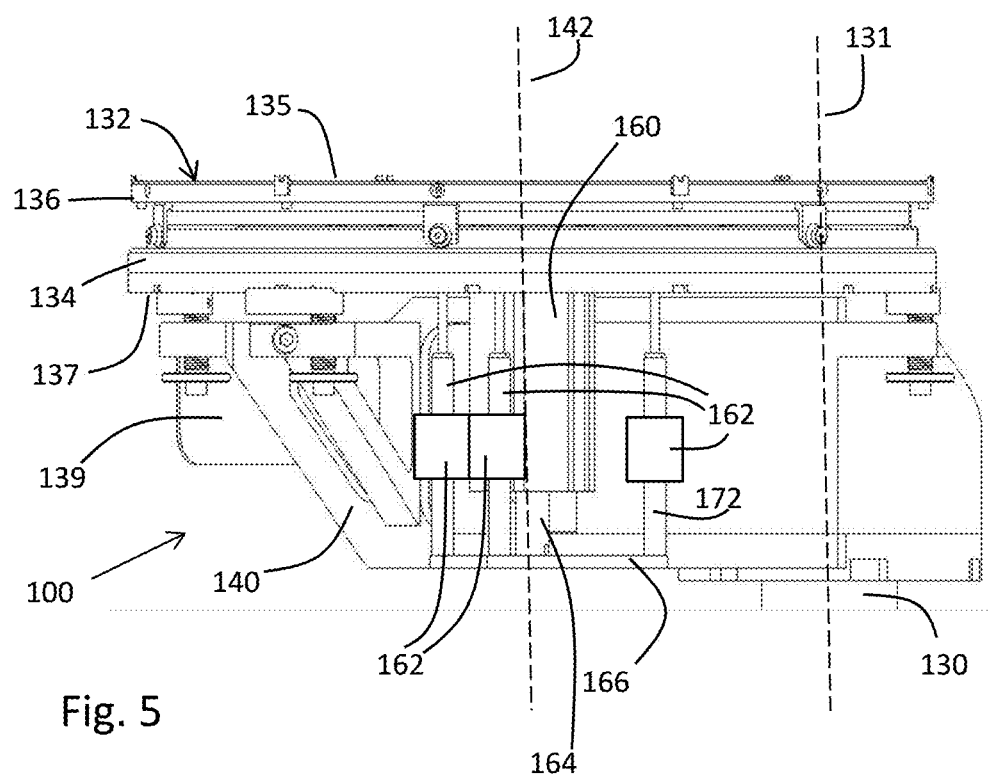
FIG. 5 is a side perspective view of the chamber assembly configuration of FIG. 4.

FIGS. 3 to 13 illustrate a chamber assembly 100 incorporating an illustrative embodiment of a lift pin system 112 (also referred to as lift pin assembly 112) of the present invention. Chamber assembly 100 is identical to chamber assembly 10 of FIGS. 1 and 2, except that chamber assembly 100 incorporates lift pin system 112 rather than lift pin system 12. For purposes of clarity, some components of chamber assembly 100 (such as a gate valve, handles, sensor assembly, exhaust system, drive, and rotary seal corresponding to gate valve 20, handles 22, sensor assembly 24, exhaust system 26, drive 28, and rotary seal 31, respectively, of FIGS. 1 and 2) are not shown but could be present in chamber assembly 100 in an identical fashion. Chamber assembly 100 is particularly useful to carry out cryogenic treatments such as those described in U.S. Pat. Pub. Nos. 2018-0130694 A1; 2018-0151396A1; 2018-0214915 A1; 2018-0158717 A1; and in U.S. Pat. No. 9,564,378; and in Assignee's co-pending U.S. application Ser. No. 16/278,398, filed Feb. 18, 2019 in the name of Chimaobi W. Mbanaso, titled MICROELECTRONIC TREATMENT SYSTEM HAVING TREATMENT SPRAY WITH CONTROLLABLE BEAM SIZE. Each of these patent documents is incorporated herein by reference in its respective entirety for all purposes.

Lift pin system 112 is useful to help pick and place a substrate such as wafer 111 (see FIGS. 12 to 14) within a process chamber 116 inside housing 114. In this illustrative embodiment, all of the moving components of the lift pin assembly 112 are housed within the process chamber 116. In many conventional tools such as the system shown in FIGS. 1 and 2, some moving components, such as actuation devices, have been placed outside of the process chamber 116 to isolate particle sources resulting from friction sources or lubricants caused by the moving parts of the actuation device or by the lubricants applied to the actuation device. Those conventional systems may have used mechanical or pneumatic components to drive/control lift pin movement. In contrast, lift pin system 112 of the present invention uses electromagnetic actuation strategies to raise and lower lift pins. Because electromagnetic actuation forces can act remotely from a distance, moving parts may be isolated from each other, i.e., they are separated by physical gaps as they move relative to each other. This significantly reduces or eliminates the friction between moving and contacting parts, which reduces the likelihood of particle generation. Lubricants also may be avoided. As a result, the actuation device and moving lift pin assembly may be placed within the process chamber 116 with minimal impact on particle contamination on the substrate. For example, in the illustrative embodiment, the new lift pin system 112 reduces or eliminates sliding surfaces and avoids contact points that have been typical in the mechanical/pneumatic actuation device designs of the prior art.

Additionally, the new actuation device eliminates the need to have an ex-situ actuation device that's coupled to an in-situ lift pin assembly through a vacuum-sealing port. Eliminating the vacuum-sealed port removes another potential contamination source from the process chamber.

Referring to FIGS. 3 to 13, chamber assembly 100 generally includes a housing 114 defining a process chamber 116. Housing incorporates an egress 118 through which wafers 111 (see FIGS. 12 to 14) can be loaded into and taken from the process chamber 116. During treatments, a variety of different pressures may be used in the process chamber 116. The pressure inside process chamber 116 may be sub-atmospheric, atmospheric, or pressurized depending on the process application being used to treat a wafer.

A wafer holder in the form of a rotatable and translatable chuck 132 is housed inside the process chamber 116. Chuck 132 serves as a support plate that holds or secures a wafer during processing. Chuck 132 includes a top surface 135 and a bottom surface 137 opposite the top surface 135. Chuck 32 includes a lower chuck portion 134 and an upper chuck portion 136. Lower chuck portion 134 is mounted in off-center/eccentric fashion to rotatable shaft assembly 130 that rotates about axis 131. As a consequence of the off-center mounting of chuck 132, rotation of shaft assembly 130 causes chuck 132 to be translated in an arc-shaped path 133 (see FIG. 10) inside process chamber 116. The arc-shaped path 133 is centered about axis 131. In practical effect, the off-center rotation causes the chuck 132 to orbit the axis 131 through a suitable range of motion. As the chuck 132 translates along this arc, it is swept through a nozzle assembly 138 (see FIG. 10) that includes at least one nozzle through which treatment material can be dispensed onto wafer 111 held on the chuck 132. In some instances, the lift pin assembly 112 may be coupled to chuck 132 so that both the chuck 132 and the attached lift pin assembly 112 are transported along the translation path 133

Support structure 140 helps to support the chuck 132 as it cantilevers outward from shaft assembly 130. Shield 139 provides a barrier behind which wires, plumbing, or the like may be deployed.

In the meantime, upper chuck portion 136 is able to rotate about axis 142 independently of the lower chuck portion 134. Axis 142 is perpendicular to the top surface 135 of chuck 132. In this way, a wafer 111 secured on chuck 132 can be rotated about axis 142 and/or translated below nozzle assembly 138 in an orbit or arc-shaped path 133 about axis 131.

Figure 6:
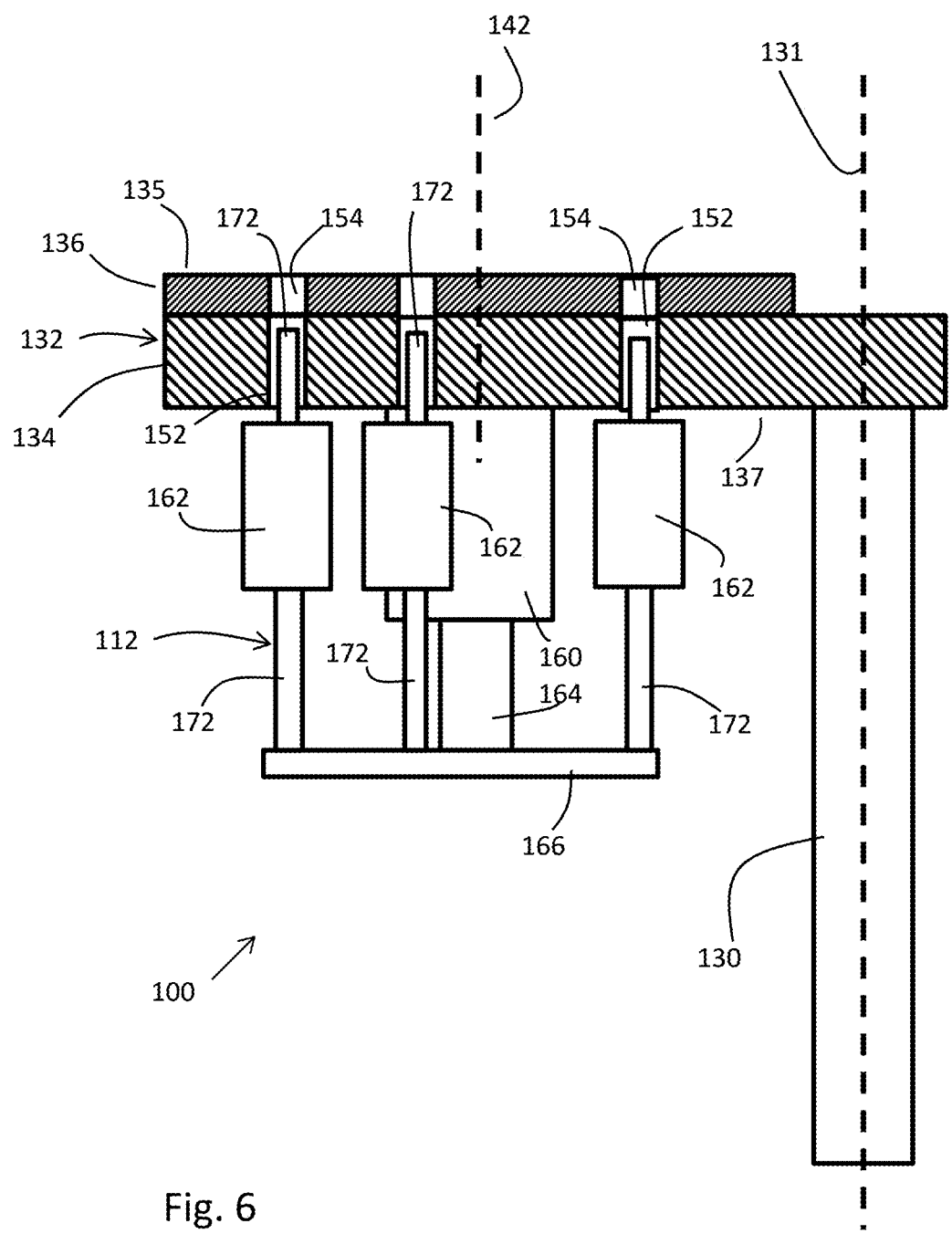
FIG. 6 is a side, schematic cross-section of the chamber assembly configuration of FIG. 4.
Figure 7:
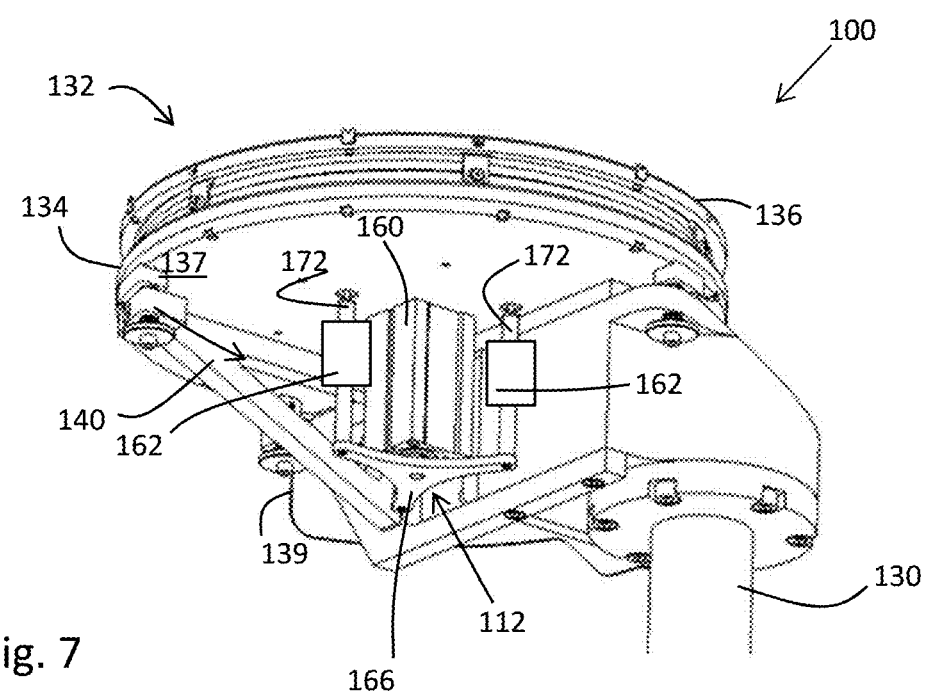
FIG. 7 is a bottom perspective view of the chamber assembly of FIG. 3, wherein the lift pin system is in a raised configuration.
Figure 8:
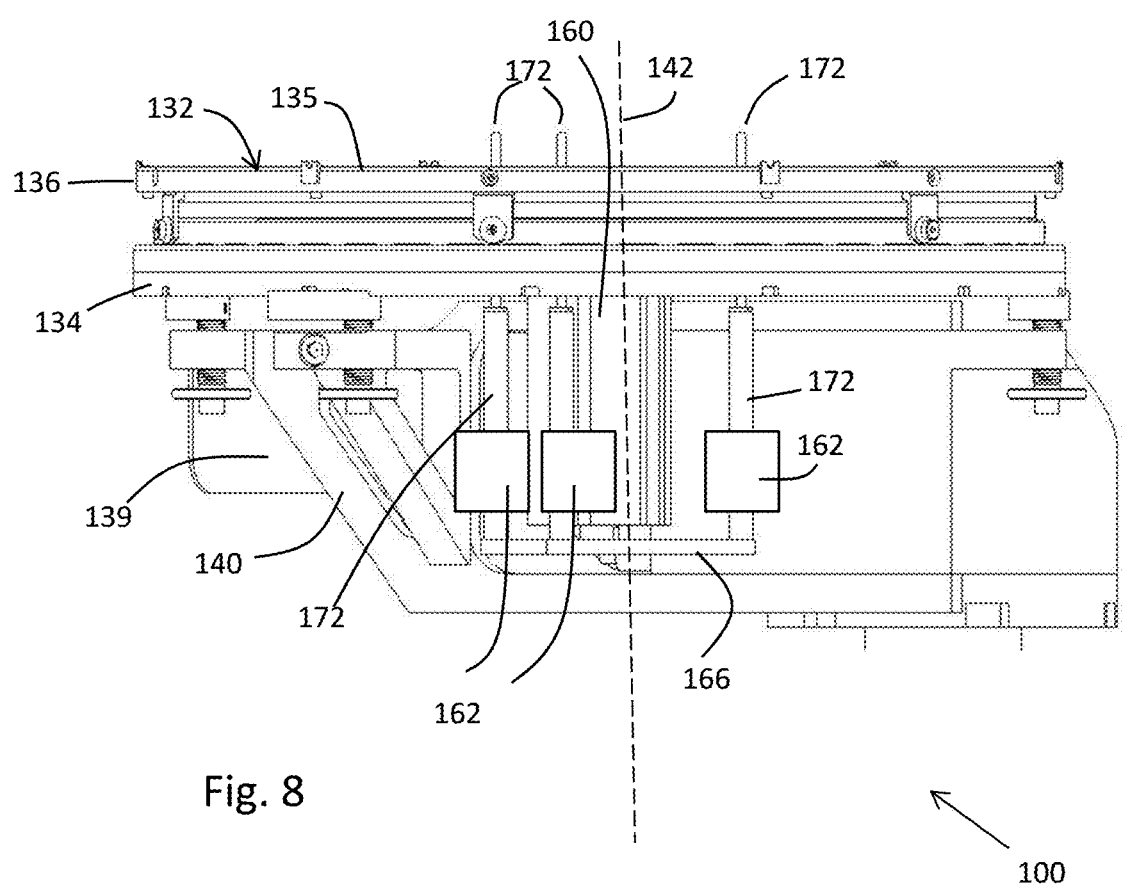
FIG. 8 is a side perspective view of the chamber assembly configuration of FIG. 7.
Figure 9:
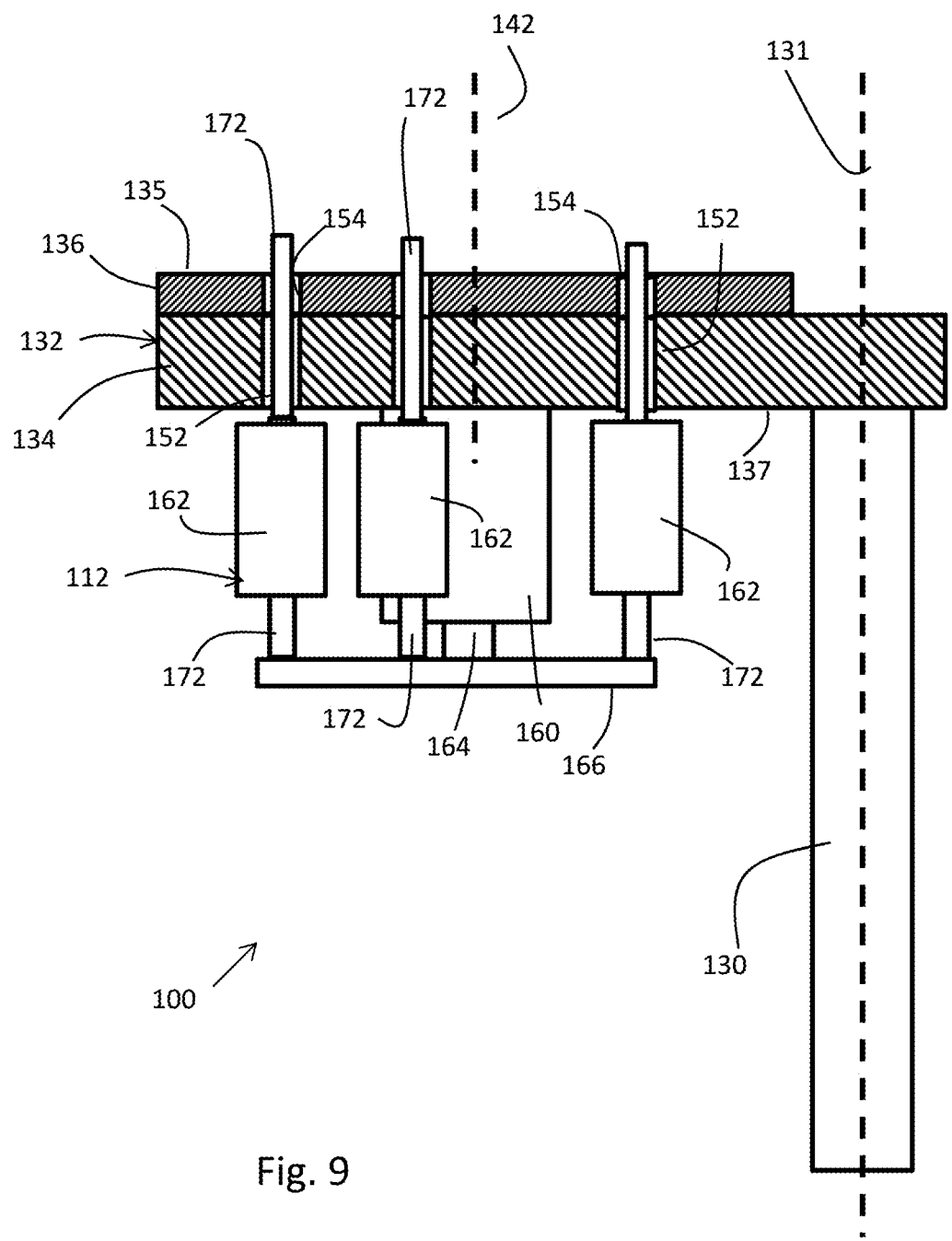
FIG. 9 is a side, schematic cross-section of the chamber assembly configuration of FIG. 7.
Figure 10:
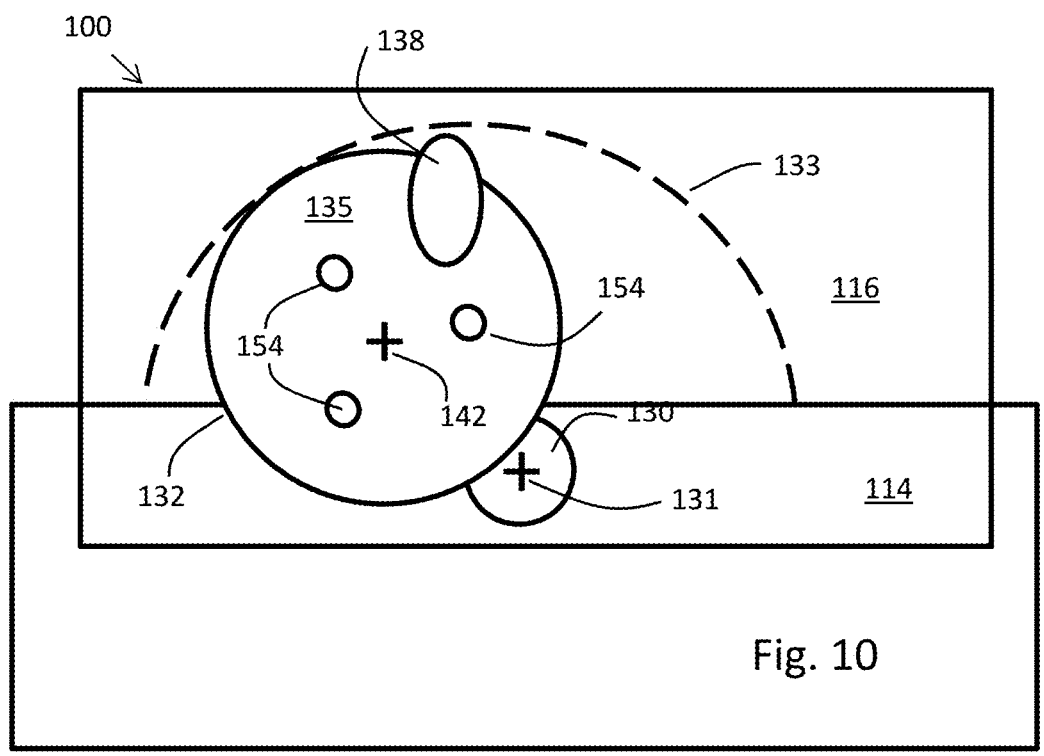
FIG. 10 is a schematic, top view of the chamber assembly of FIG. 3 showing how the chuck translates underneath a nozzle assembly in an arc-shaped path about a first axis while a chuck portion also may independently rotate about a second axis.

Lower chuck portion 134 includes lift pin apertures 152. Upper chuck portion 136 includes lift pin apertures 154. As shown in FIGS. 6 and 9, upper chuck portion 136 may be indexed to a rotation position so that apertures 152 and 154 are placed in registration to provide complete pass-through openings or pathways between the top surface 135 and the bottom surface 137 of chuck 132 for lift pins 172 to be raised and lowered through chuck 132.

Lift pin assembly 112 is disposed inside process chamber 116 proximate to the chuck 132. In this embodiment, lift pin assembly 112 is attached to the bottom surface 137 of the chuck 132. As major components, lift pin assembly includes an actuator device including actuator 160 and one or more electromagnets in the form of perimeter electromagnetic coils 162 and central electromagnetic coil 164, a lift pin support structure in the form of actuator plate 166, and lift pins 172.

Actuator 160 is an actuation device is that is electrically coupled to the electromagnetic coils 162 and 164. Actuator 160 provides electrical power to energize the coils 162 and 164 in a controlled manner effective to provide a desired lifting force, raising force, holding or hovering force, or parking signal. Actuation device 160 is disposed entirely within the process chamber 116. Actuator 160 may be hardwired or wirelessly coupled to an internal and/or external controller (not shown) in order to help respond to sensor input or instructions and provide suitable electrical power to the coils 162 and 164. Actuator 160 may be disposed on the actuator plate 166, chuck 132, or chamber component(s), or any combination thereof to enable raising and lowering of the lift pins 172. For purposes of illustration, actuator 160 is fixedly coupled to the lower side of lower chuck portion 134.

Electromagnetic coils 162 and 164 are electrically coupled to the actuator 160. The coils 162 and 164 also desirably are mounted to actuator 160 directly or indirectly by a suitable support structure (not shown) so that the actuator 160 and coils 162 and 164 are fixed relative to each other. Thus, if actuator 160 translates with chuck 132, actuator 160 and the coils 162 and 164 will translate in corresponding fashion with chuck 132 as well.

Actuator plate 166 is magnetically coupled to the coils 162 and 164 but at the same time is physically decoupled and spaced apart from the actuator 160 and the coils 162 and 164. Actuator plate has central region 168 and arms 170 supporting lift pins 172 out at the ends of the arms 170. Actuator plate 160 desirably supports three or more lift pins. For purposes of illustration, three lift pins 172 are shown.

The lift pins are axially aligned with corresponding pass-through openings in the chuck 132 to allow the lift pins 172 to be raised through the chuck 132 to protrude (first position) above the chuck 132 when the actuator moves the lift pin support structure into the up position. Similarly, the actuator can move the lift pins 172 down (second position) below the top surface of the chuck 132 and below the upper chuck portion 136. In this way, the chuck 132 and the lift pin assembly 112 are designed to allow the lift pins 172 to transition between a first, raised position and a second, lowered position, preferably without the lift pins 172 being in physical contact with other components to avoid generating particles. The pass-through openings in the chuck 132 are larger than the lift pins 172 so that contact between the pins 172 and the chuck 132 is avoided when the pins 172 are raised and lowered.

Magnetically responsive rods 179 and 181 also are mounted to the actuator plate 166. Magnetically responsive rods 179 and 181 fit inside of coils 162 and 164 but are able to move up and down relative to the coils 162 and 164 without physical contact with the coils 162 and 164. In this regard, there is an annular gap between each of rods 179 and 181 and the corresponding, surrounding coil.

When coils 162 and 164 are energized, the coils push or pull the rods 179 and 181 upward or downward in a manner that correlates to the level of energizing. In a typical mode of operation, coils 162 and 164 are configured so that coils 162 apply electromagnetic force on rods 179 in one direction while coil 164 applies electromagnetic force on rod 181 in the opposite direction. This means that the electromagnetic forces on rods 179 oppose the electromagnetic force acting on rod 181. This opposition between the magnetic forces provides more accurate, fast control when raising and lowering the lift pins 172.

In the illustrated embodiment, the electromagnetic system uses a combination of magnet actuators in the form of the coils 162 and 164 that exert magnetic forces on the magnetically responsive rods 179 and 181. Controlled by actuator 160, the coils 162 and 164 are capable of actuating the electromagnetic forces to pull or push the rods 179 and 181 in a desired direction. Because rods 179 and 181 are coupled to the actuator plate 166 that also holds the lift pins 172, driving the actuator plate 166 in turn allows the lift pins 172 to be raised and lowered on demand.

The magnetic coils 162 and 164 are arranged and the magnetic polarity is controlled to move the lift pins 172 together in unison to raise or lower the wafer at three or more contact points. The lift-pin assembly 112 will actuate up or down based on the pushing and pulling forces on the magnetically responsive rods 179 and 181. The lift pins 172 can be caused to travel for a certain distance in a relatively smooth manner to minimize the contact force between the lift pins 172 and the backside of the wafer 111.

The travel distance of the lift pin actuator plate 166 may be determined based on factors such as the physical dimensions and relative arrangement and sizes of the chuck 132, the robot end effector, lift pins 172, rods 179 and 181, electromagnet coils 162 and 164, or combination thereof. In some embodiments the travel distance and speed may be controlled using sensors 178 to detect the position of the lift pin actuator plate 166 or the lift pins 172. The electromagnetic field strength of the electromagnet coils 162 and 164 may be controlled to optimize the pushing and pulling of the magnetically responsive rods 179 and 181 to avoid physical contact between the lift pin assembly, the actuation device, and the wafer holder.

Figure 12:
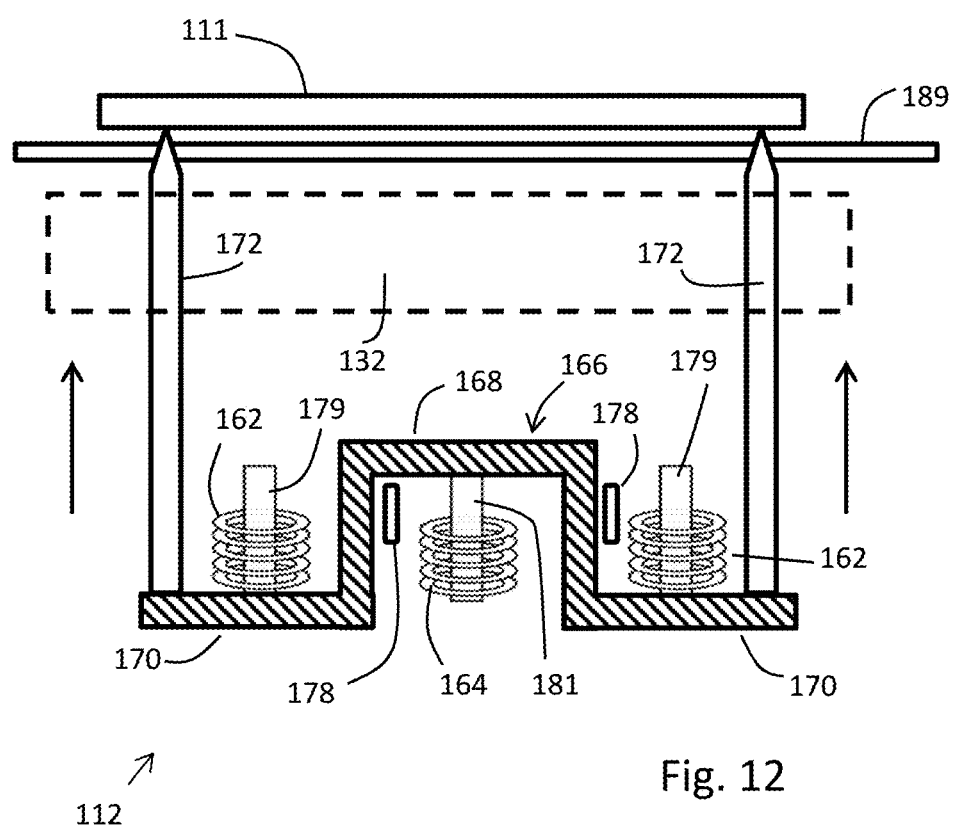
FIG. 12 is a schematic side view of the electromagnetic lift pin system of the present invention shown in a raised configuration.

FIGS. 7, 8, 9, and 13 show the lift pin assembly 112 in a raised (first) configuration. In this configuration, the apertures 152 and 154 in chuck portions 134 and 136 are in registration. This allows lift pins 172 to project upward through the chuck 132 with the tips of the lift pins 172 above the top surface 135. FIG. 12 shows how wafer 111 may be supported on the raised lift pins 172. In this configuration, a robot end effector 188 may enter the process chamber 116, reach under the wafer 111 and then lift and remove the wafer 111. Alternatively, this is also the configuration in which a robot end effector 188 can place wafer 111 onto the lift pins 172. After the end effector 188 leaves the chamber, the lift pins 172 can be lowered to place the wafer 111 onto chuck 132.

FIGS. 4, 5, 6, and 12 show the lift pin assembly 112 in a lowered (second) configuration. In this configuration, lift pins 172 are below the upper chuck portion 136 as shown best in FIG. 6. Because the lift pins 172 are below the upper chuck portion 136, upper chuck portion 136 can rotate about rotation axis 131 without interference from the pins 172. If a wafer 111 had been supported on the pins 170 when they were lowered, this configuration allows the wafer 111 to be held on chuck 132 as shown in FIG. 11 while upper portion 136 rotates and/or chuck 132 translates along path 133.

Figure 13:
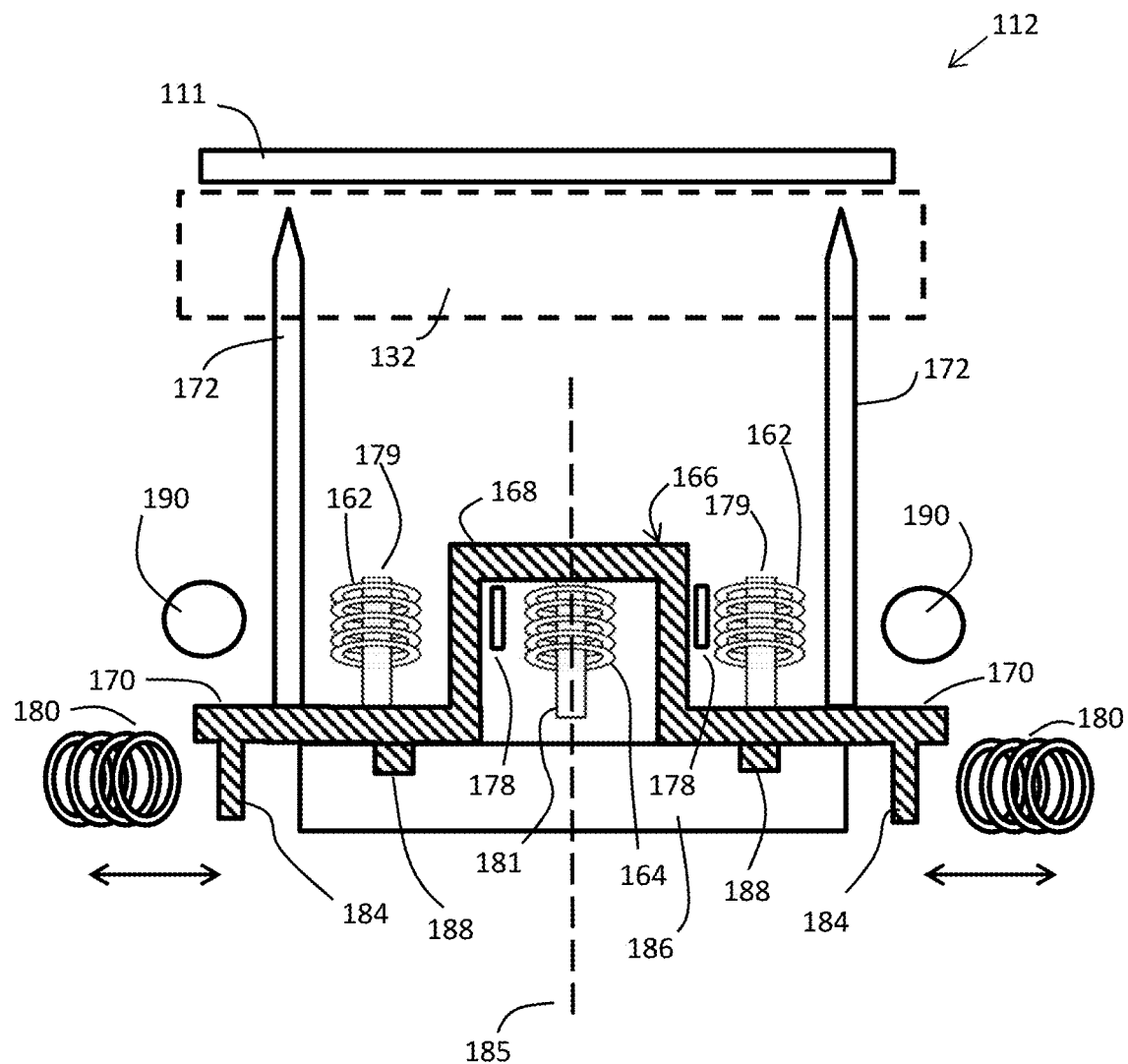
FIG. 13 shows additional, optional features that may be incorporated into the lift pin system of FIGS. 11 and 12.

FIGS. 12 and 13 show more details of how magnetic coils 162 and 164 are used in one embodiment to generate electromagnetic forces to raise and lower lift pins 172 in the lift pin system 112 of the present invention. The electromagnetic forces are used to transition the lift pin assembly between the up (FIGS. 3, 7, 8, 9, and 13) and down (FIGS. 4, 5, 6, 12, and 14) positions. In this embodiment, three magnetically responsive rods 179 and 181 are physically coupled to the actuator plate 166. Each rod 179 and 181 is magnetically coupled to a corresponding electromagnetic coil 162 or 164. In this specific embodiment, the rods 179 and 181 are axially aligned to be parallel to the lift pins 172. A controller (not shown) is electrically connected to the actuator, which in turn is responsive to the controller to send electric power to the coils 162 and 164. The characteristics of the magnetic field of the coils 179 and 181 can be controllably varied, such as by controlling both strength and field direction by adjusting how the electric power is delivered to the coils 179 and 181. Thus, responsive to the controller, actuator 160 is designed to vary the magnetic field strength to push/pull the rods 179 and 181 in order to control the deployment of the lift pins 172, such as to cause the lift pins 172 to be in as well as transition between the first and second positions.

The controller sends signals to control characteristics such as the field strength and direction based on the information that includes information sensed from one or more position sensors 178. In the embodiment shown in FIGS. 12 and 13, two sensors 178 are used to determine the location of the lift pin components relative to the desired first and second positions. The controller may assess the relative position of the sensors 178 with respect to one or more sensor flags (not shown) to provide an indication of position the lift pin support structure within the process chamber 116. The sensor flags may include any sensor-compatible material coupled to one or more suitable sites such as the lift actuator plate 166, chuck 132, rods 179 or 181, or the like.

Figure 11:
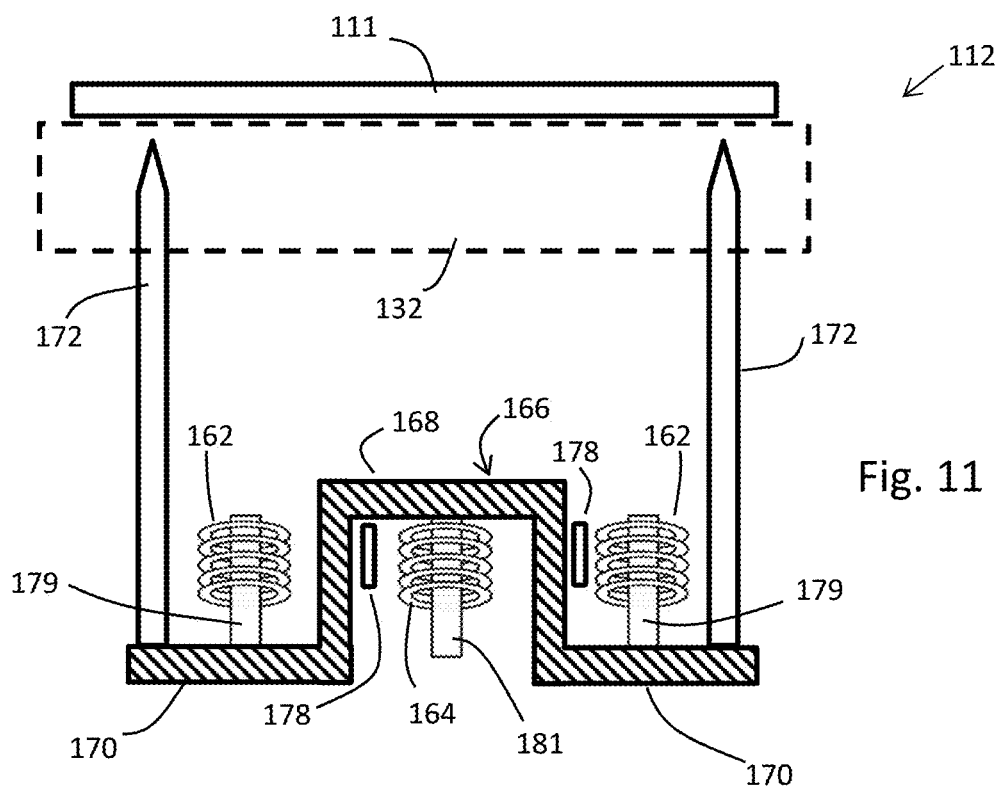
FIG. 11 is a schematic side view of the electromagnetic lift pin system of the present invention shown in a lowered configuration.

FIG. 11 the lift pin system 112 in a lowered configuration. The lift pins 172 are below the top surface 135 of the chuck 132. A wafer 111 has been lowered onto and is secured on chuck 132 by this lowering action. To achieve this configuration from a raised configuration, coils 162 are energized to produce electromagnetic forces that push rods 179, and hence actuator plate 166 and lift pins 172, downward. At the same time, the central coil 164 is energized to push rod 181 upwards. The downward forces of coils 162 and the upward force of coil 164 are balanced to achieve controlled lowering of the lift pins 172. Sensors 178 can sense the rate of movement so that the forces can be adjusted so that the lowering occurs at a suitable speed. Once in the lowered position, the coils 162 and 164 can be energized in a manner to hold the lift pin system 112 in the lowered configuration.

FIG. 12 shows the lift pin system in a raised configuration. The lift pins 172 project above the top surface of the chuck 132 and support a wafer 111 above the chuck 132 so that a gap 183 exists between the supported wafer 111 and the chuck 132. A robot arm can fit in the gap 183 in order to pick or place wafer 111 onto the raised lift pins 172. To achieve this configuration from a lowered configuration, coils 162 are energized to produce electromagnetic forces that push rods 179, and hence actuator plate 166 and lift pins 172, upward. At the same time, the central coil 164 is energized to push rod 181 downwards. The upward forces of coils 162 and the downward force of coil 164 are balanced to achieve controlled raising of the lift pins 172. Sensors 178 can sense the rate of movement so that the forces can be adjusted so that the raising occurs at a suitable speed. Once in the raised position, the coils 162 and 164 can be energized in a manner to hold the lift pin system 112 in the raised configuration.

FIG. 13 shows how lift pin system 112 may include one or more, additional, optional features. For purposes of illustration, FIG. 13 shows system 112 in a lowered configuration similar to the configuration of FIG. 11. As one optional feature, system 112 may include one or more centering coils 180 that push and pull against one or more magnetically responsive flange(s) 184. Desirably, at least three such coils 180 are used and are radially aligned to aim at the center axis 185. The coils 180 may be positioned in equal increments around the center axis 185. For example, when using three coils 180, these are placed at increments of 120 degrees around the center axis 185. If four coils 180 were to be used, then these could be placed at increments of 90 degrees around the center axis 185. Coils 180 may be energized in order to electromagnetically push and pull on the one or more flanges 184 in order to help keep the lift pin assembly 112 in an accurate position relative to the center axis 185.

As another optional feature, lift pin system 112 may incorporate a landing pad 186. When this is used, the lift pin assembly 112 may be lowered until actuator plate 166 rests on the landing pad 186 when the system 112 is placed into the lowered configuration. The landing pad 186 and actuator plate may incorporate corresponding key features 188 in order for actuator plate 166 to land on pad 186 in an accurate lowered position.

As another option, lift pin system 112 may include stops 190. Stops 190 help to limit the upward range of travel of the actuator plate 166 and lift pins 172. Landing pad 186 and stops 190 may be formed from a material such as a fluoropolymer or other low friction material (e.g., PTFE, PFA, PVDF, PEEK or combinations thereof). as such materials are inert to many process treatment chemicals. Such materials also present a low risk of generating undue particle contamination.

All patents, patent applications, and publications cited herein are incorporated herein by reference in their respective entities for all purposes. The foregoing detailed description has been given for clarity of understanding only. No unnecessary limitations are to be understood therefrom. The invention is not limited to the exact details shown and described, for variations obvious to one skilled in the art will be included within the invention defined by the claims.

What is claimed is:

1. An apparatus for treating a microelectronic substrate, said apparatus comprising:
   a process chamber in which the microelectronic substrate is subjected to a treatment;
   a wafer holder disposed within the process chamber, wherein the wafer holder comprises a top surface and a bottom surface opposite the top surface, wherein the microelectronic substrate is held over the top surface during a treatment, and wherein the wafer holder comprises and at least three pass-through openings between the top surface and the bottom surface; and
   a lift-pin assembly disposed within the process chamber and proximate to the wafer holder, the lift pin assembly comprising:
   a lift pin support structure;
   three or more lift pins connected to the lift pin support structure, each of the three or more lift pins being axially alignable with a corresponding pass-through opening in the wafer holder so that the lift pins can be raised and lowered through the wafer holder such that the lift pins project above the top surface of the wafer holder in a first, raised configuration and such that the lift pins are below the top surface of the wafer holder in a second, lowered configuration;

first and second magnetically responsive rods mounted to the lift pin support structure;

first and second electromagnetic coils, wherein the first and second magnetically responsive rods fit inside the first and second electromagnetic coils, respectively;

an actuator device disposed in the process chamber that is electrically coupled to the first and second electromagnetic coils in a manner such that the actuator device provides electric power that energizes the first and second electromagnetic coils, wherein the energized first electromagnetic coil applies an electromagnetic force on the first magnetic rod in one direction, wherein the energized second electromagnetic coil applies an electromagnetic force to the second magnetic rod in an opposite direction, wherein the electromagnetic forces of the energized electromagnetic coils is controlled to push and pull on the first and second magnetic rods so that the lift pin assembly can be raised or lowered on demand; and wherein the electromagnetic forces act remotely to raise and lower the lift pin assembly.

2. The apparatus of claim 1, wherein the lift pin support structure comprises two or more magnetically responsive rods that are magnetically coupled to the actuator device in a manner to magnetically raise and lower the lift pin assembly.

3. The apparatus of claim 2, wherein the actuator device comprises two or more electromagnetic coils that are magnetically coupled to the magnetically responsive rods in a manner effective to move the lift pins without the electromagnetic coils contacting the magnetically responsive rods.

4. The apparatus of claim 1, wherein the lift pins move through the wafer holder during a transition between the first, raised position and the second, lowered position.

5. The apparatus of claim 1, wherein the actuator device is attached to the wafer holder and where the apparatus further comprises a translation mechanism that translates the wafer holder and the lift-pin assembly along a translation pathway.

6. The apparatus of claim 1, further comprising a landing pad that helps to hold the lift pin assembly when the lift pin assembly is in the second, lowered configuration.

7. The apparatus of claim 6, wherein the landing pad comprises a low-friction material.

8. The apparatus of claim 7, where the low-friction materials comprises one or more of PTFE, PFA, PVDF, PEEK, or combinations thereof.

9. The apparatus of claim 3, wherein moving between the first and the second positions is based, at least in part, on an electromagnetic coupling between the lift pin structure and the actuation device.

10. The apparatus of claim 1, further comprising a first position sensor coupled to the lift pin assembly in a manner effective to detect a position of the lift pin assembly.

11. The apparatus of claim 10, further comprising a second position sensor coupled to the lift pin assembly in a manner effective to detect a position of the lift pin assembly.

12. The apparatus of claim 2, wherein the magnetically responsive rods are axially aligned to be parallel to the lift pins.

13. The apparatus of claim 2, wherein the magnetically responsive rods comprise a temporary, permanent or electromagnetic magnet.

14. The apparatus of claim 10, wherein the lift pin assembly comprises a first position sensor flag having a position that is detected by the first position sensor.

15. The apparatus of claim 1, wherein the actuator device exerts opposed magnetic forces on the lift pin assembly.

16. A method of raising and lowering a lift pin assembly, comprising the steps of:

providing a wafer holder in a process chamber, wherein the wafer holder comprises a top surface and a bottom surface opposite the top surface, wherein the microelectronic substrate is held over the top surface during a treatment, wherein the wafer holder comprises and at least three pass-through openings between the top surface and the bottom surface, and wherein the wafer holder comprises a lower chuck portion and an upper chuck portion, wherein the upper chuck portion rotates about a center axis independently of the lower chuck portion, wherein each of the lower chuck portion and the upper chuck portion comprises apertures that are placed in registration to provide the pass-through openings;

providing a lift pin assembly comprising a plurality of lift pins supported on a lift pin support structure, each of said lift pins being axially alignable with a corresponding pass-through opening in the wafer holder so that the lift pins can be raised and lowered through the wafer holder such that the lift pins project above the top surface of the wafer holder in a first, raised configuration and such that the lift pins are below the top surface of the wafer holder in a second, lowered configuration; and using a magnetic force to remotely raise and lower the lift pin assembly such that electromagnetic forces act remotely to raise and lower the lift pin assembly.

17. An apparatus for treating a microelectronic substrate, said apparatus comprising:

a process chamber in which the microelectronic substrate is subjected to a treatment;

a wafer holder disposed within the process chamber, wherein the wafer holder comprises a top surface and a bottom surface opposite the top surface, wherein the microelectronic substrate is held over the top surface during a treatment, wherein the wafer holder comprises and at least three pass-through openings between the top surface and the bottom surface, and wherein the wafer holder comprises a lower chuck portion and an upper chuck portion, wherein the upper chuck portion rotates about a center axis independently of the lower chuck portion, wherein each of the lower chuck portion and the upper chuck portion comprises apertures that are placed in registration to provide the pass-through openings; and a lift-pin assembly disposed within the process chamber and proximate to the wafer holder, the lift pin assembly comprising:

a lift pin support structure; and three or more lift pins connected to the lift pin support structure, each of the three or more lift pins being axially alignable with a corresponding pass-through opening in the wafer holder so that the lift pins can be raised and lowered through the wafer holder such that the lift pins project above the top surface of the wafer holder in a first, raised configuration and such that the lift pins are below the top surface of the wafer holder in a second, lowered configuration; and an actuator device disposed in the process chamber that is magnetically coupled to the lift pin assembly such that the actuator device magnetically raises and lowers the lift pin assembly such that electromagnetic forces act remotely to raise and lower the lift pin assembly.

* * * * *